June 27, 1967 J. R. CHIPMAN 3,328,700

MEANS FOR FINE TUNING TELEVISION RECEIVERS WITH A.F.C. DISABLER

Filed Nov. 4, 1964 2 Sheets-Sheet 1

INVENTOR.
JACK R. CHIPMAN
BY
Lockwood, Woodard, Smith & Weikart
Attorneys

June 27, 1967 J. R. CHIPMAN 3,328,700

MEANS FOR FINE TUNING TELEVISION RECEIVERS WITH A.F.C. DISABLER

Filed Nov. 4, 1964 2 Sheets-Sheet 2

INVENTOR.
JACK R. CHIPMAN
BY
Lockwood, Woodard, Smith & Weikart
Attorneys

United States Patent Office 3,328,700

Patented June 27, 1967

3,328,700

MEANS FOR FINE TUNING TELEVISION RECEIVERS WITH A.F.C. DISABLER

Jack R. Chipman, Fort Wayne, Ind., assignor to The Magnavox Company, Fort Wayne, Ind., a corporation of Delaware Filed Nov. 4, 1964, Ser. No. 408,853
8 Claims. (Cl. 325—457)

ABSTRACT OF THE DISCLOSURE

Apparatus for manual fine tuning in receivers equipped with automatic frequency control (A.F.C.) wherein a "defeat" switch is operated during manual fine tuning to defeat the A.F.C., but is not operated during normal channel selection. This switch is activated through a cam and follower arrangement by manually operating an appropriate fine tuning control to adjust the fine tuning components of the television receiver, the switch remaining activated by the control while the adjustment is made, but then automatically returning to deactivated condition.

This invention relates generally to radio signal receivers and more particularly to receivers having a detent type of tuner with adjustable tuning slugs for each of a plurality of channel selector strips in a turret-type of tuner.

In radio and television receivers employing detent types of tuners, rapid coarse tuning is easily achieved. Tuner strips on a turret-type of tuner are frequently provided with adjustable slugs so that, by proper adjustment of the slug in each strip, reasonably close tuning for each channel can be obtained as the tuner moves from one detent position to the next. However, the demands on tuners for highly accurate frequency control and resetability on all channels are not consistent with reasonable tuner costs. Therefore, automatic frequency control (A.F.C.) means for automatic fine tuning of tuner oscillators are employed according to one feature of the invention.

With A.F.C. for the tuner oscillator, if the user of the television receiver makes the fine tuning adjustment of the tuning slug while the A.F.C. system is functioning, he may adjust the slug to the point where the picture looks acceptable but a good deal of A.F.C. correction voltage is present. This condition could very well be at the limit of the "hold in range" and would not give the proper "pull-in" performance when the channel selector is switched into the channel.

It is a general object of the present invention to provide means for automatic fine tuning a receiver but which minimizes demands upon the automatic fine tuning system thereof and enhances the performance of the receiver.

A further object is to provide means whereby an A.F.C. system of the automatic fine tuning would only be required to correct for oscillator frequency drift and for the inability of a user to precisely tune to the correct point.

A further object is to provide a system whereby the A.F.C. system for automatic fine tuning of the receiver is defeated while the user is making the manual fine tuning adjustments for the various channels in pre-setting the tuner.

Described briefly, in a typical embodiment of the present invention, a discriminator is connected to the output of the third I-F stage of the receiver and produces an A.F.C. voltage. This voltage is applied to a varicap in the oscillator of the tuner.

A normally-open defeat switch is connected between ground and the A.F.C. control voltage source in the receiver. This switch is normally held open by a disc mounted to a movable block on which are mounted several idler gears. This block is normally held in an inactive position by a spring and, when the block is in the inactive position, the disc thereon holds the defeat switch open. However, a fine tuning adjustment knob is provided with a cam surface and gear thereon which, when the knob is pushed in, linearly pulls the idler gear train into engagement with the gear on the adjustment knob and also with a gear on a fine tuning slug in a tuner strip of the tuner turret. This movement of the gear block out of the inactive position allows the defeat switch to close which defeats the normal function of the A.F.C. system so that it does not affect performance during the user's adjustment of the tuning slug by rotation of the tuner member. Then, when the fine tuning knob is released by the user, the block again moves under the spring bias to the inactive position whereupon the defeat switch is opened and the A.F.C. system can take over and correct for drift and any error in adjustment by the user.

The full nature of the invention will be understood from the accompanying drawings and the following description and claims:

Figure 1:
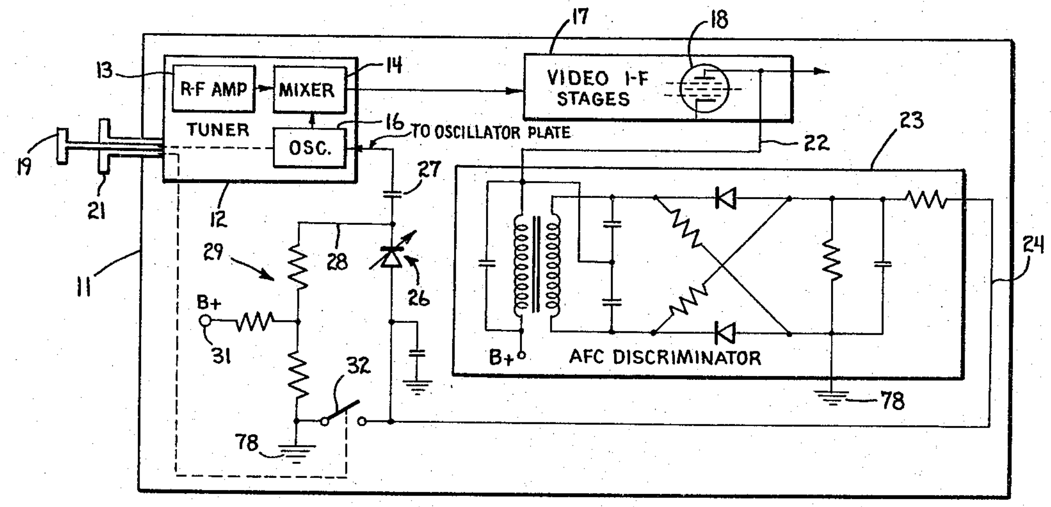
FIG. 1 is an electrical diagram of a portion of a television receiver, the diagram being partially in block and partially schematic and illustrating the means for automatic fine tuning in the television receiver and the defeat switch thereof.

Referring now to the drawings in detail, the television receiver 11 has a tuner therein employing the usual components such as an R-F amplifier 13, mixer 14, and oscillator 16. The mixer output is coupled to the video I-F stages 17 which include a third video amplifier pentode 18. The tuner includes a channel selecting control knob 19 and a fine tune adjusting knob 21 for changing the tuned frequency of the oscillator in a conventional manner. However, according to one feature of the invention, an automatic fine tune system is provided.

The automatic fine tune system derives an input on conductor 22 from the anode of the third video amplifier 18. This input is coupled to a discriminator 23 which produces an automatic frequency control (A.F.C.) voltage output on the conductor 24. This output is connected to the anode of the voltage variable capacitor (varicap) 26, the cathode of which is connected by capacitor 27 to the oscillator 16, wherein the connection can be to the anode of an oscillator triode, for example. The various values in the discriminator are such that when the tuner local oscillator places the converted picture carrier on its correct I-F frequency and, therefore, no correction voltage is required, the A.F.C. voltage on conductor 24 is zero.

The cathode of the varicap is connected through a conductor 28 to the voltage divider 29, one arm of which is connected to the B plus terminal 31. There is thereby established on the varicap a suitable back bias so that when the A.F.C. voltage increases or decreases, the proper variation of capacitance will be obtained to change the LC product of the oscillator tuned circuits and shift the oscillator frequency the desired amount in the proper direction.

In order to defeat the A.F.C. voltage during manual fine tuning for presetting the tuner, a normally-open defeat switch 32 is provided between the conductor 24 and ground 78 for operation during pre-setting the tuner according to another feature of the invention.

Figure 2:
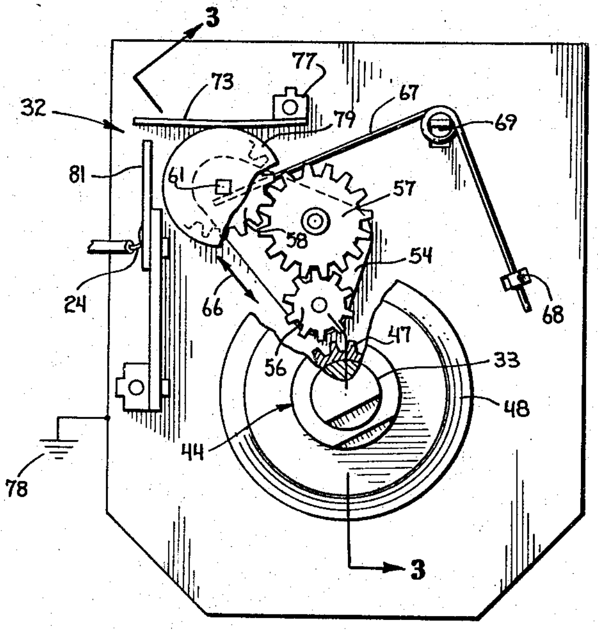
FIG. 2 is a front elevational view of television tuner mechanism with the defeat switch thereon.
Figure 3:
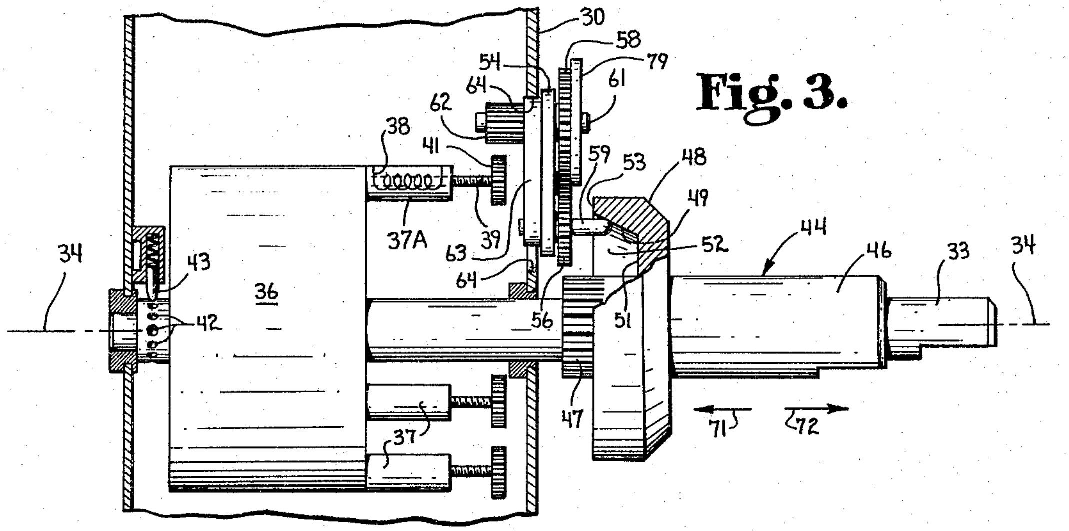
FIG. 3 is a fragmentary section through the tuner taken along the line 3—3 in FIG. 2 and viewed in the direction of the arrows with a portion of the tuner being omitted or shown schematically to better illustrate the operating structure.

Referring now to FIGS. 2 and 3, the tuner assembly includes a tuner frame 30 in which the channel selector shaft 33 operated by knob 19 (FIG. 1) is mounted for rotation on the fixed rotational axis 34. A turret drum 36 is affixed to the shaft and has a plurality of channel strips 37 mounted thereto in an equally spaced circular array. Only three of these strips are shown in the drawing, in order to conserve space and improve clarity of illustration. Each of these strips, such as strip 37A for example, has an oscillator coil 38 therein and a metal tuning slug 39 threadedly received in the front end thereof. At the front end of each of these slugs is a small gear 41 which facilitates fine tuning in a manner which will be described. Any appropriate detent means 42 and 43 can be mounted to the shaft and frame, respectively, to securely hold the shaft and turret drum in any one of the plurality of rotational positions which will switch the various channel strips into the tuner circuitry for tuning the receiver to the various channels corresponding to the various strips. Detent and switching means are well known and, therefore, are not further described herein.

A fine tune "shaft" 44 is provided in the form of a sleeve 46 coaxial with and slidable linearly on shaft 33 and having the knob 21 (FIG. 1) on the outer end. A drive gear 47 is mounted at the rear end of this sleeve and a drive wheel 48 is mounted on the sleeve. This wheel 48 has a conical surface 49 therein coaxial with the sleeve and diverging from a front wall 51 of the cavity 52 to the rear marginal edge 53 of the drive wheel.

As is best seen in FIG. 2, an idler gear mounting block 54 is provided with first, second and third idler gears 56, 57, and 58, respectively, mounted for rotation thereon. These gears are mounted on shafts having parallel axes, and the gears are constantly in mesh. The shaft 59 for gear 56 projects forwardly into the cavity 52 and the end portion thereof contacts the conical surface 49 near the rear end 53 of the drive wheel 48. The shaft 61 to which the gear 58 is mounted extends through the block 54 and into the interior of the tuner frame and has a gear 62 mounted thereon.

Block 54 has an elongated ridge 63 therein received in an elongated slot 64 in the front face of the tuner frame, the ridge being shorter than the slot and thereby accommodating movement up and down of the block in the frame in the direction of the arrows 66. Normally, a wire spring 67 having one end anchored to the frame at 68, the center anchored at 69, has the other end engaging the shaft 61, forcing the block to the upper limit of its travel. In this condition, gear 62 is out of mesh with the gear 41 on the tuning slug of the channel selected by the selector shaft 33, and idler gear 56 is out of mesh with the fine tune drive gear 47.

In order to obtain fine tuning of the channel associated with the strip 37A, the fine tune member 44 is pushed in the direction of the arrow 71. This causes the conical surface 49 to force the shaft 59 and therefore the gear mounting block 54 inwardly toward the axis 34, the slot 64 in the frame guiding the ridge in the block in this direction. This action placed the idler gear 56 in mesh with drive gear 47 and the gear 62 in mesh with the gear 41. Therefore, by rotation of the fine tune shaft in either direction, the tuning slug can be moved in or out of the coil 38. This varies the inductance of the oscillator coil mounted on the selector strip and shifts the frequency of the local oscillator 16 as required to properly receive the incoming television channel for amplification of the intermediate frequency by the intermediate frequency amplifiers of the receiver.

When the user then releases the fine tune shaft, the return spring will move the block back up to its inactive position which causes the frontal portion of the idler gear shaft 59 to move the wheel 48 and shaft 46 therewith out in the direction of the arrow 72. The channel selector shaft may then be turned one or more detents to place another channel strip in active position and switch it into the oscillator circuitry whereupon fine tuning of this channel can be achieved in the same manner.

Figure 4:
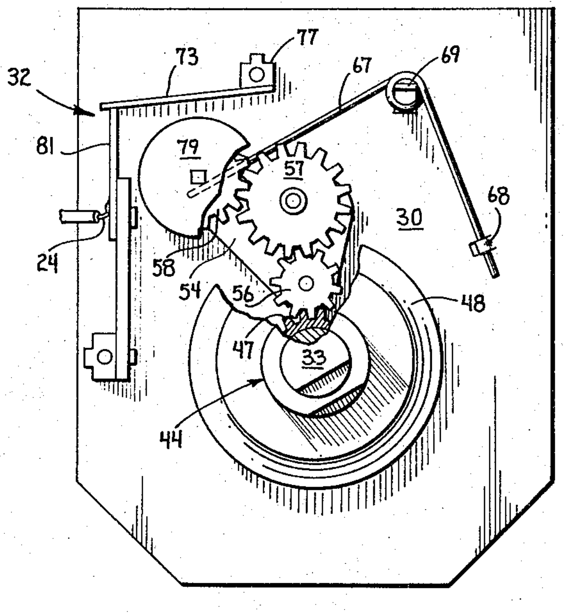
FIG. 4 is a view like FIG. 2 but showing the defeat switch closed.

As mentioned in the introduction to this description, if the A.F.C. system is operating during this pre-setting for each of the channels, it is possible that the user would merely tune to the point where the picture looks acceptable but which is achieved only because a considerable A.F.C. correction voltage is present. In order to avoid this, and the demands upon the A.F.C. system which it naturally imposes, the A.F.C. defeat switch 32 (FIG. 1) is employed according to this invention. This defeat switch includes a phosphorous bronze spring leaf 73 having one end affixed to the tuner frame 30 at 77, the tuner frame being grounded as indicated at 78 (FIG. 2). A disc 79 mounted to the third idler gear shaft 61 normally engages the central portion of this spring contact leaf, and holds it in the position shown by the solid outline in FIG. 2. The switch also includes a second contact 81 which is affixed to the frame but insulated therefrom. This contact 81 is connected by the conductor 24 (FIG. 1) to the A.F.C. voltage source 23. As shown in FIG. 2, the switch is open. However, when the fine tune shaft is pushed in for fine tuning the slugs, and pulls the gear mounting block 34 down in the slot, as shown in FIG. 4, the disc 79 separates from the spring leaf and allows it to make contact with the fixed contact 81 as shown in FIG. 4. The A.F.C. voltage is thereby grounded so that it is not affecting the tuning during the pre-setting of the channels.

In addition to achieving the foregoing objects, the present invention lends itself to achievement of the desired results with inexpensive materials and a minimum of complexity.

While the invention has been disclosed and described in some detail in the drawings and foregoing description, they are to be considered as illustrative and not restrictive in character as other modifications may readily suggest themselves to persons skilled in this art and within the broad scope of the invention, reference being had to the appended claims.

The invention claimed is:

1. In a television receiver having automatic fine tuning circuitry therein, the combination comprising:
- means having an output and producing an automatic frequency control voltage at said output;
- an automatic frequency control defeat switch coupled to said output;
- a tuner mechanism coupled to tuner circuitry in said receiver and including a manually operable channel selector means;
- a plurality of fine tuning elements, each of said elements being mounted to said channel selector means;
- a manually operable fine tuning member engaging one of said elements to enable manual fine tuning of the receiver for the channel corresponding to said one element;
- a movable contact of said defeat switch being operable by said member during manual fine tuning to disable the automatic fine tune circuitry of said receiver.

2. In a television receiver having automatic fine tuning circuitry therein, the combination comprising:
- a tuner having an oscillator therein;
- a source of automatic frequency control voltage;
- variable impedance means coupled to said source and to said tuner and responsive to changes of said control voltage to change the frequency of said oscillator in said tuner;
- an automatic frequency control defeat switch coupled to said source and operable, when actuated, to prevent said control voltage from changing the frequency of said oscillator;
- a manually operable channel selector means in said tuner;

a plurality of fine tuning elements, each of said elements being mounted to said channel selector means and each, when actuated, establishing a predetermined frequency in said oscillator for reception of a television channel;

a manually operable fine tuning means engaging one of said elements to enable manual fine tuning of the receiver for the channel corresponding to said one element;

said defeat switch being actuated by said fine tuning means during manual fine tuning.

3. In a television receiver having automatic fine tuning circuitry therein, the combination comprising:

an oscillator;

a source of automatic frequency control voltage;

means coupled to said source and to said oscillator and responsive to changes of said control voltage to change the frequency of said oscillator;

a defeat switch coupled to said source and operable, when actuated, to prevent said control voltage from changing the frequency of said oscillator;

a channel selector means coupled to said oscillator;

a plurality of fine tuning elements, each of said elements being mounted to said channel selector means and each, when actuated, establishing a frequency in said oscillator for reception of a television channel;

a manually operable fine tuning means engaging one of said elements to enable manual fine tuning of the receiver for the channel corresponding to said one element;

said defeat switch being actuated by said fine tuning means during manual fine tuning.

4. In a television receiver, the combination comprising:

a tuner having a tuner frame and having oscillator means therein;

an automatic frequency control voltage source coupled to said oscillator means to effect automatic fine tuning thereof;

a switch coupled to said source and operable when actuated to prevent said source from effecting automatic fine tuning of said oscillator;

a channel selector shaft having a tuner turret drum thereon with a plurality of channel strips thereon, each strip having an oscillator coil thereon, said shaft also having detent means thereon whereby said shaft is readily positionable in each of a plurality of rotational positions to switch different ones of said oscillator coils into circuit in said oscillator means for coarse tuning corresponding television channels;

a plurality of threaded oscillator tuning slugs, each of said slugs being threadedly received in one of said channel selector strips for movement relative to the oscillator coil thereof, and each of said slugs having a gear mounted thereon, the rotational axis of each of the gears being colinear with the thread axis of the slug, said channel selector shaft being mounted for rotation on said fixed axis in a tuner frame;

an idler gear mounting block mounted to said tuner frame and guided thereon for linear relative movement thereon toward and away from the said fixed axis of said channel selector shaft;

first, second, and third idler gears mounted on said block with their rotational axes parallel to the axis of said channel selector shaft, said first gear having a shaft thereon and said gears being constantly engaged for rotation of all upon rotation of one;

a fourth gear connected to said third gear through a shaft providing a common rotational axis therefor, and said fourth gear being disposed for engagement with one of said tuner slug gears when said idler block is moved radially inwardly toward the axis of said channel selector shaft, the tuner slug gear with which said fourth gear is engageable being the one disposed in the channel selector strip positioned where the coil thereof is switched into circuit in said oscillator for tuning a channel corresponding thereto;

a fine tuning sleeve slidingly received on said channel selector shaft and co-axial therewith, said sleeve having an external gear at an inner end thereof engageable by said first idler gear simultaneously with engagement of said fourth idler gear with said one of the tuner slug gears whereby rotation of said fine tuner sleeve is transmitted to said one slug to enable manual fine tuning;

a cam in the form of a conical surface on a wheel attached to said fine tuner sleeve, said cam being engaged with the said shaft of said first idler gear and operable upon movement of said sleeve toward said first gear to move said block and said gears radially inward toward the axis of said channel selector shaft to engage said first gear with the external gear on the sleeve and to engage the fourth gear with the tuner slug gear;

an abutment mounted on said tuner frame;

a return spring normally biasing said block against said abutment and thereby positioning said block at an outer limit radially from said selector shaft axis where said fourth and first idler gears are disengaged respectively from said tuner slug gear and said external gear on said sleeve;

said switch having a fixed insulated contact mounted to said tuner frame and a resilient movable contact grounded to said frame;

and a disc mounted to said third idler gear and engaging said movable contact and holding said movable contact apart from said fixed contact when said block is at said outer limit, the resilience of said movable contact moving it into contact with said fixed contact and thereby actuating said switch when said cam moves said block and said idler gears radially inwardly into engagement with said external gear and said tuner slug gear.

5. In a television receiver, the combination comprising:

a tuner including a frame;

a source of automatic frequency control voltage;

variable impedance means coupled to said source and to said tuner and responsive to changes of said control voltage to change oscillator frequency in said tuner;

an automatic frequency control defeat switch having an actuator and coupled to said source and operable, when actuated, to prevent said control voltage from changing oscillator frequency;

channel selector means in said tuner including a plurality of channel strips, said selector means being positionable in a plurality of discrete rotational positions and thereby activating one of said tuner strips in said tuner in each position for coarse tuning a corresponding television channel;

a plurality of oscillator tuning slugs, each of said slugs being threadedly received in one of said channel strips, and each of said slugs having a slug drive member thereon, the rotational axis of each of the drive members being colinear with the thread axis of the slug, said channel selector means being mounted for rotation on a fixed axis in the tuner;

an idler gear mounting block mounted to said tuner frame and guided thereon for linear relative movement thereon toward and away from said fixed axis;

an idler gear mounted on said block with its rotational axis parallel to said fixed axis;

a driver mounted to said block and drivable by said idler gear and disposed for engagement with the slug drive member for the activated tuner strip when said idler block is moved radially inwardly toward said fixed axis;

a rotatable fine tuning member having a drive gear thereon engageable by said idler gear simultaneously with engagement of said driver with said slug drive member whereby rotation of said fine tuning member is transmitted to said slug to enable manual fine tuning of the coarsely tuned channel;

a cam on said fine tuning member, and operable on said block upon linear movement of said fine tuning member to move said idler gear radially inward into engagement with said drive gear and the driver into engagement with the slug drive member;

a return spring normally biasing said block into an inactive position where said driver and idler gear are disengaged respectively from said slug drive member and said drive gear;

said actuator being controlled by said block to avoid actuation of said switch when said block is at its inactive position, and to actuate said switch when said cam moves said idler gear radially inwardly into engagement with said drive gear.

6. In a television receiver, the combination comprising:

oscillator means;

a source of an automatic frequency control voltage;

means coupled to said source and to said oscillator means and responsive to changes of said control voltage to change the frequency of said oscillator means;

a switch coupled to said source;

a channel selector having a plurality of channel strips, each channel strip including impedance means, said selector being readily positionable in each of a plurality of rotational positions to switch the impedance means of different ones of said strips into circuit in said oscillator means for coarse tuning corresponding television channels;

a plurality of tuning elements, each of said elements being movably received in one of said channel strips for varying the impedance means thereof, and each of said tuning elements having a drive member thereon;

a driver movable from a first position of disengagement from said drive member to a second position of engagement with said drive member;

a fine tuning member;

means coupling said fine tuning member to said driver and operable by said fine tuning member to move said driver from said first position to said second position to enable said fine tuning member to drive one tuning element for fine tuning of a channel;

said switch being coupled to said fine tuning member and operable thereby, upon movement of said fine tuning member to position said driver to said second position, to prevent said control voltage from changing the frequency of said oscillator.

7. In a television receiver having automatic fine tuning circuitry therein, the combination comprising:

means having an output coupled to said automatic fine tuning circuitry and producing an automatic frequency control voltage at said output;

an automatic frequency control defeat switch coupled to said output and operable, while being actuated, to disable the automatic frequency control voltage from operating said automatic fine tuning circuitry;

a tuner mechanism in said receiver and including a manually operable channel selector means;

fine tuning means associated with said channel selector means;

a manually operable fine tuning member coupled to said fine tuning means to enable manual fine tuning of the receiver for various channels selected by said manually operable channel selector means;

and means coupling said automatic frequency control defeat switch to said manually operable fine tuning member for actuation of said switch by said fine tuning member, only during manual fine tuning by said fine tuning member.

8. In a television receiver having automatic fine tuning circuitry therein, the combination comprising:

means having an output coupled to said automatic fine tuning circuitry and producing an automatic frequency control voltage at said output;

a defeat switch coupled to said output and operable, when actuated, to disable the automatic frequency control voltage from effecting automatic fine tuning;

a tuner mechanism in said receiver and including a channel selector means;

fine tuning means including a manually operable fine tuning member operable when actuated, to obtain manual fine tuning of said receiver;

said defeat switch being coupled to said manual fine tuning member for actuation of said defeat switch thereby only during actuation of said manual fine tuning member.

References Cited

UNITED STATES PATENTS

| | | | |
|---|---|---|---|
| 3,166,714 | 1/1965 | VoDinh Hien | 325—457 |
| 3,236,109 | 2/1966 | Stewart et al. | 334—51 X |

KATHLEEN H. CLAFFY, *Primary Examiner.*

R. LINN, *Assistant Examiner.*